United States Patent [19]

Meyer

[11] Patent Number: 5,331,208

[45] Date of Patent: Jul. 19, 1994

[54] NON-RETRIGGERABLE ONE-SHOT CIRCUIT

[75] Inventor: Charles S. Meyer, Nevada City, Calif.

[73] Assignee: NVision, Inc., Nevada City, Calif.

[21] Appl. No.: 924,316

[22] Filed: Aug. 3, 1992

[51] Int. Cl.$^5$ .......................................... H03K 3/284
[52] U.S. Cl. ................................ 307/273; 307/352; 307/261; 307/359; 307/265; 328/36
[58] Field of Search ............... 307/273, 352, 353, 261, 307/358, 359, 265; 328/35, 36

[56] References Cited

U.S. PATENT DOCUMENTS

| | | | |
|---|---|---|---|
| 3,883,756 | 5/1975 | Dragon | 307/273 |
| 4,207,539 | 6/1980 | Minakuchi | 307/273 |
| 4,301,422 | 11/1981 | Minakuchi | 307/273 |
| 4,320,527 | 3/1982 | Takasaki | 307/273 |
| 4,994,687 | 2/1991 | Fujii et al. | 307/291 |
| 5,086,237 | 2/1992 | Matsumoto | 307/273 |
| 5,276,664 | 1/1994 | Shikunami | 307/359 |

Primary Examiner—Timothy P. Callahan
Assistant Examiner—Terry D. Cunningham
Attorney, Agent, or Firm—Smith-Hill and Bedell

[57] ABSTRACT

A non-retriggerable one-shot circuit for extracting information representative of a clock having a period T from a sequence of input pulses such that the interval between two consecutive input pulses is either T or T/2 comprises a frequency detector for developing a reference voltage dependent on T, an interval measurement circuit connected to receive the input pulses and developing a voltage dependent on the time that has elapsed since receiving an input pulse, a comparator for comparing the voltage developed by the interval measurement circuit with the reference voltage and providing an output pulse when a predetermined relationship exists therebetween, and an enabling device connected between the input terminal and the interval measurement circuit and responsive to an output pulse for allowing a pulse received at the input terminal to be communicated to the interval measurement circuit.

11 Claims, 2 Drawing Sheets

NON-RETRIGGERABLE ONE-SHOT CIRCUIT

BACKGROUND OF THE INVENTION

This invention relates to a non-retriggerable one-shot circuit.

One form of non-return-to-zero (NRZ) data coding is known as biphase coding. In biphase coding, a signal epoch is divided into time slots by a clock, and one source data bit occupies a single time slot. Each source data bit may be represented by a two-cell doublet. Each coding doublet begins, and therefore also ends, with a transition. A source data bit one generates a transition between the two cells of the doublet, whereas a source data bit zero does not. Thus, a source data bit zero is represented either as the doublet zero zero or the doublet one one, while a source data bit one is represented either by the doublet one zero or the doublet zero one.

In order to recover data from a biphase coded signal, it is necessary first to extract clock information from the signal. A conventional circuit for extracting clock information from a biphase coded signal is shown in FIG. 1. The biphase signal (FIG. 1, waveform A) is first differentiated and rectified, by applying the biphase signal and a delayed version thereof to respective inputs of an exclusive OR gate 2, so as to produce a signal (waveform B) that has one pulse for each transition of the biphase coded signal. The resulting pulse train is applied to a non-retriggerable one-shot 4 having a period equal to approximately 75% of the clock period. On the second transition of the first source data bit zero, the one-shot is set and its output (waveform C) remains high for 75% of the next clock period. If the next source data bit is also zero, the one-shot is set by the pulse that corresponds to the transition at the end of that bit, and if the next source data bit is one, the one-shot filters out the pulse that occurs between the two cells of the doublet and is set by the pulse corresponding to the transition at the end of that source data bit. The output of the one-shot is therefore a pulse train at the clock frequency and having a 75% duty cycle.

The output of the clock extraction circuit may be applied to the phase detector of a phase locked loop, to control operation of a voltage-controlled oscillator whose output constitutes the extracted clock signal and is applied to a data recovery circuit, such as a flip-flop.

The Audio Engineering Society/European Broadcasting Union datastream for digital audio data consists of a biphase coded signal in which each audio sample is represented by a subframe containing 32 time slots. The first four time slots of the subframe constitute a preamble containing at least one occurrence of the three cell sequence zero zero zero or one one one. However, so long as the time constant of the loop filter of the phase locked loop exceeds the duration of the preamble, this brief departure from the biphase coding rules does not disturb operation of the phase locked loop to such an extent as to prevent accurate recovery of data.

The Audio Engineering Society and European Broadcasting Union standards do not prescribe the clock frequency of the biphase coded signal used for the digital audio datastream. In different applications, clock frequencies ranging from 28 kHz to 54 kHz are employed, and this wide range in frequency can cause problems in clock extraction and data recovery. For example, a switch may be connected to select from multiple AES/EBU signal sources having different clock frequencies, but the clock extraction technique described with reference to FIG. 1 cannot be used to extract clock information reliably from the selected signal because a conventional non-retriggerable one-shot, having a fixed period, cannot be used to extract clock information in the manner described with reference to FIG. 1 unless the clock frequency of the biphase coded signal lies within a fairly narrow range.

SUMMARY OF THE INVENTION

According to the present invention there is provided a non-retriggerable one-shot circuit for extracting information representative of a clock having a period T from a sequence of input pulses such that the interval between two consecutive input pulses is either T or T/2, said circuit having an input terminal and comprising a frequency detector for developing a reference voltage dependent on T, an interval measurement circuit connected to receive the input pulses and developing a voltage dependent on the time that has elapsed since receiving an input pulse, a comparator for comparing the voltage developed by the interval measurement circuit with the reference voltage and providing an output pulse when a predetermined relationship exists therebetween, and enabling means connected between the input terminal and the interval measurement circuit and responsive to an output pulse for allowing a pulse received at the input terminal to be communicated to the interval measurement circuit.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
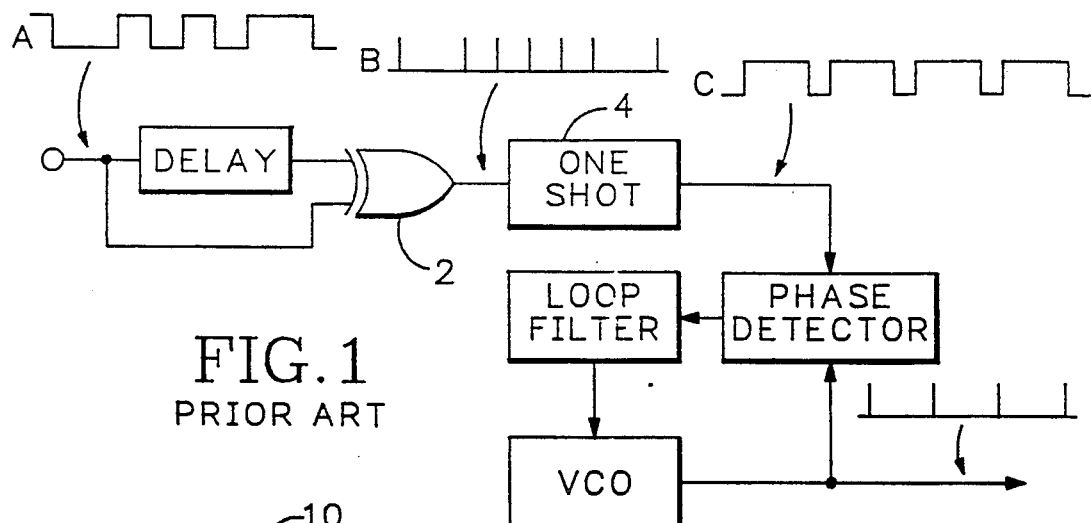
FIG. 1 is a block diagram of a conventional circuit for extracting clock information from a biphase coded signal.
Figure 2:
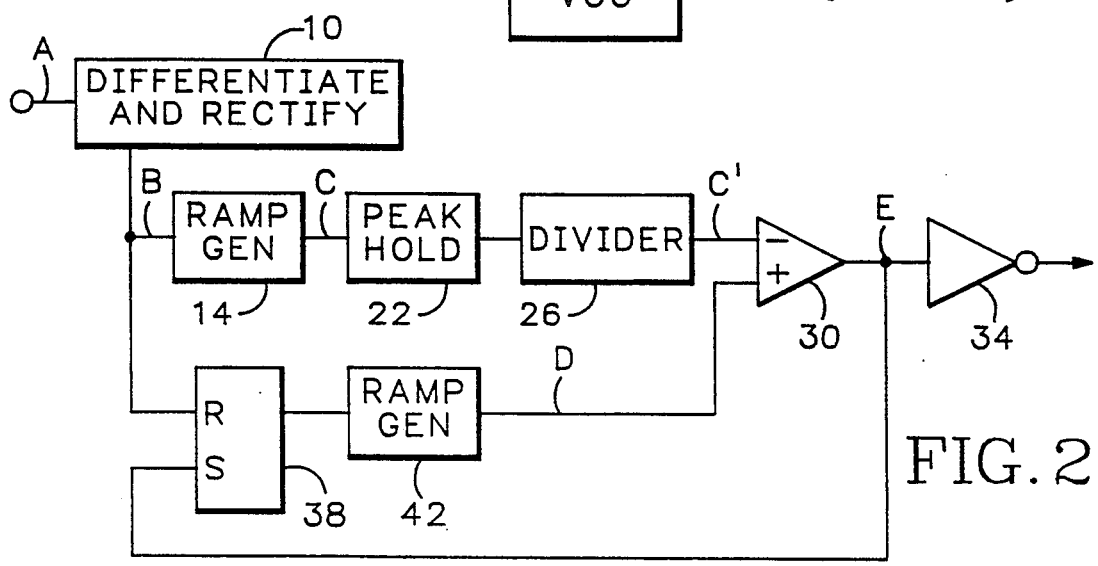
FIG. 2 is a block diagram of a circuit embodying the invention, for extracting clock information from a biphase coded signal.
Figure 3:
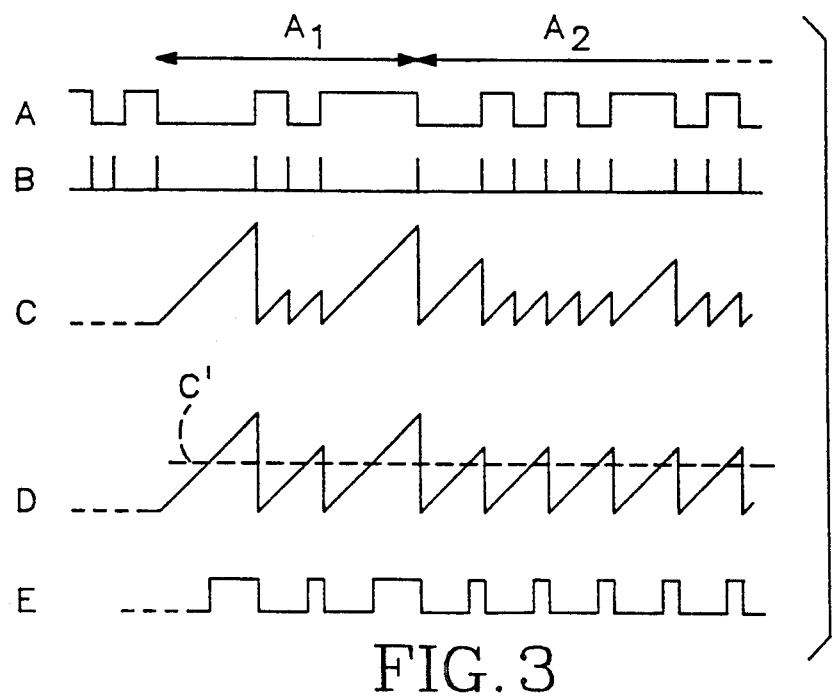
FIG. 3 is graph illustrating operation of the FIG. 2 circuit.

The circuit shown in FIG. 2 has an input stage 10 that receives an AES/EBU biphase coded signal (FIG. 3, waveform A) including a preamble A1 and data A2 and differentiates and rectifies the biphase coded signal to generate a signal (FIG. 3, waveform B) that includes a pulse sliver in response to each transition of the biphase coded data signal. The output of the input stage 10 is applied to the reset input of a retriggerable ramp generator 14. So long as the output signal of the input stage 10 is low, the ramp generator 14 generates a signal having a linearly increasing voltage (FIG. 3, waveform C). When the output signal of the input stage 10 goes high, the ramp generator 14 is reset so that its output voltage falls substantially to zero, and when the output of the input stage 10 again goes low, the voltage of the output signal starts to increase linearly once more. The voltage of the output signal of the ramp generator is equal to $k*t$, where k is a constant and t is the time that has elapsed since the output signal of the input stage 10 last went low.

The output signal of the ramp generator 14 is applied to a peak hold circuit 22, which provides an output signal whose voltage is equal to the peak voltage of the output signal of the ramp generator over a predetermined interval that is much longer than the clock period of the input signal. The peak voltage of the output signal of the ramp generator 14 is attained when t has its maximum value. If the clock period of the biphase coded signal is T, the interval between consecutive pulses of the signal B is T/2, T or 3*T/2. Therefore, the maximum value of t is 3*T/2 and the peak voltage of the output signal of the ramp generator 14 is 3*k*T/2. The output of the peak hold circuit is applied to a divider 26, which provides an output signal (FIG. 3, waveform C') having a voltage equal to approximately 50% of the output voltage of the peak hold circuit, or 3*k*T/4. The output of the divider 26 is applied to the inverting input of a comparator 30, whose output signal (waveform E) is applied to an inverter 34.

The output of the input stage 10 is also applied to the R input of an R-S latch 38, and the output of the comparator 30 is connected to the S input of the latch. The output of the latch 38 is connected to the reset input of a second ramp generator 42, which is identical to the ramp generator 14, and the output of the ramp generator 42 is connected to the non-inverting input of the comparator 30.

Upon receipt of the pulse corresponding to the second transition of a source data bit zero, the latch 38 applies a pulse to the ramp generator 42, which is reset so that its output voltage falls to zero, and when the output of the latch 38 goes low, the output of the ramp generator starts to increase linearly in accordance with the function k*t', where t' is time since the input of the ramp generator 42 last went low. At this point, the output of the comparator 30 is low, and this disables the latch 38 from communicating a pulse received at its R input to the ramp generator 42.

The output voltage of the ramp generator 42 reaches the output voltage of the divider 26 when t'=3*T/4, and the output of the comparator 30 then goes high and the output of the inverter 34 goes low. The output of the comparator 30 enables the latch 38, so that the next pulse received from the input stage 10 is communicated to the ramp generator 42. It will therefore be seen that the circuit shown in FIG. 2 filters out the pulse that occurs between the two cells of a doublet that codes a source data bit one and generates a pulse train at the output of the inverter 34 that is at the same frequency as the clock of the input signal and has a 75% duty cycle, regardless of the length of the clock period of the biphase coded signal.

The absence of pulses at the end of two of the time slots during the preamble of the AES/EBU frame perturbs operation of the clock extraction circuit, but proper operation is restored after the preamble. If the output of the one-shot is used to control operation of a phase locked loop, the perturbation is insufficient to disturb operation of the phase locked loop.

Figure 4:
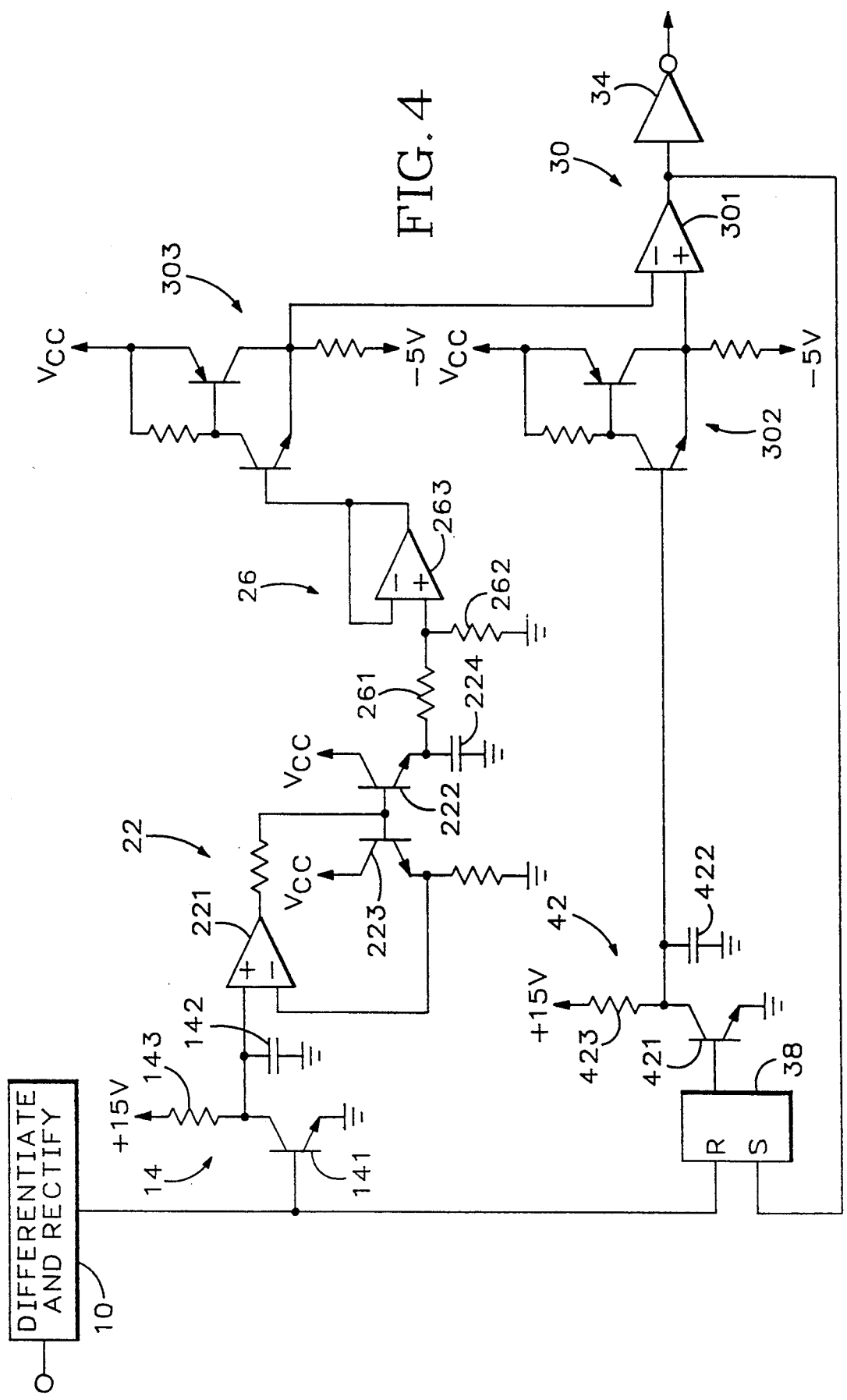
FIG. 4 is a schematic diagram of a discrete-component implementation of the circuit shown in FIG. 2.

Referring to FIG. 4, which illustrates a discrete-component implementation of the circuit shown in FIG. 2, the ramp generator 14 comprises a transistor 141, a storage capacitor 142 and a current source implemented by a resistor 143 connected between the collector of the transistor 141 and a high voltage rail, e.g. 15 volts. When the input of the ramp generator 14 is low, the transistor 141 is non-conductive and the capacitor 142 charges through the resistor 143. When the input of the ramp generator 14 goes high, the transistor becomes conductive and allows the capacitor to discharge substantially completely. The values of the capacitor 142 and resistor 143 are chosen so that at the lowest expected clock frequency, i.e. 28 kHz, the capacitor 142 charges to a voltage of about 3 volts in the time 3*T/2, so that the voltage across the resistor 143 does not change by more than about 20%, and therefore the current supplied by the resistor 143 is essentially independent of frequency.

The peak hold circuit 22 comprises a FET follower amplifier 221 that receives the output of the ramp generator 14 at its non-inverting input and has its output connected to a hold capacitor 224 by way of an emitter follower transistor 222 serving as a catch diode. The output of the amplifier 221 is also connected to the base of a second emitter follower transistor 223, which matches the transistor 222 and has its emitter connected to the inverting input of the amplifier 221. The amplifier 221 isolates the capacitor 142 from the transistors 222 and 223. When the output voltage of the ramp generator 14 exceeds the voltage to which the capacitor 224 has charged, the amplifier 221 and transistor 222 charge the capacitor 224 further. By placing the transistor 223 in the feedback path of the follower amplifier 221, the voltage on the capacitor 224 is made substantially equal to the peak voltage on the capacitor 142, instead of being one base-emitter drop below that voltage.

Although the capacitor 224 typically has a capacitance of about 2700 pF, it presents a load of only about 50–100 pF to the amplifier 221 due to the current gain of the transistor 222. This improves the stability of the amplifier 221 and keeps the difference between the peak voltage attained by the capacitor 142 and the voltage on the capacitor 224 to a minimum.

The divider 26 comprises two resistors 261 and 262 connected in series between the emitter of the transistor 224 and ground. The connection point of the resistors 261 and 262 is connected to the non-inverting input of a FET follower amplifier 263, which functions as a high impedance buffer to isolate the capacitor 224. The values of the resistors 261 and 262 are selected so that the voltage at the non-inverting input of the follower amplifier 263 is approximately 50% of the peak voltage stored on the capacitor 224. This voltage is applied through the amplifier 263 to the inverting input of the comparator 30.

The ramp generator 42 is identical to the ramp generator 14 and comprises a transistor 421, a capacitor 422 and a current source implemented by a resistor 423. On receipt of the pulse representing the end of a source data bit zero, the output of the latch 38 briefly goes high, and the transistor 421 of the ramp generator 42 is turned on, discharging the capacitor 422. When the output of the latch goes low at the end of the pulse, the capacitor 422 starts to charge once more, and continues to charge until the transistor 421 is turned on.

The comparator 30 comprises an operational amplifier 301, a buffer 302 connected between the ramp generator 42 and the non-inverting input of the operational amplifier, and a buffer 303 connected between the divider 26 and the inverting input of the amplifier 301. The buffer 302 provides a very high impedance input to the amplifier 301 and isolates the capacitor 422 of the ramp generator 42 from the amplifier 301, so that it is not essential that the input impedance of the amplifier 301 be high. The buffer 303 is identical to the buffer 302. Use of identical buffers as shown ensures that the inputs to the amplifier 301 are matched with respect to both temperature change and voltage shift.

The output of the comparator 30 is connected to the S input of the latch 38. When the output of the comparator is high, it enables the latch 38 to communicate the next pulse provided by the input stage 10 to the ramp generator 42, thereby resetting the ramp generator 42. So long as the output of the comparator 30 is low, the latch provides a logical zero output regardless of the output of the input stage 10, thereby preventing the ramp generator 42 from being retriggered.

If the clock period of the data increases, indicating a reduction in the clock frequency, the period for which the ramp generator 14 charges the capacitor 142 increases, and consequently the peak voltage held by the capacitor 224 increases also. If the clock period decreases, the charge on the capacitor 224 bleeds off through the resistors 261, 262 until it is equal to the new peak value of the ramp. The capacitor 224 and the resistors 261, 262 have a time constant of about 1 ms, and therefore they are able to respond to an increase in clock frequency within about 50 clock periods, depending on the clock frequency.

It will be appreciated that the invention is not restricted to the particular implementation that has been described, and that variations may be made therein without departing from the scope of the invention as defined in the appended claims and equivalents thereof. For example, it is not essential to the invention that the divider be implemented as a resistive potential divider, since the same result may be achieved by selecting the appropriate values for the ramp capacitors. Moreover, by selecting resistor values that provide a different ratio, the circuit may be used to extract the clock from biphase coded data that does not include a code violation, or other NRZ data. Although FIG. 4 shows a discrete component implementation of the circuit shown in FIG. 2, the circuit lends itself well to implementation in monolithic form using CMOS technology.

I claim:

1. A non-retriggerable one-shot circuit for extracting information representative of a clock having a period T from a sequence of input pulses such that the interval between two consecutive input pulses is either T or T/2, said circuit having an input terminal for receiving said input pulses and comprising:
   a frequency detector connected to said input terminal for developing a reference voltage dependent on T, the frequency detector comprising a ramp generator for generating a voltage ramp of which the amplitude depends on the time that has elapsed since occurrence of an input pulse in said sequence, and a hold circuit for holding the peak voltage of the ramp,
   an interval measurement circuit,
   a comparator for comparing the voltage developed by the interval measurement circuit with the reference voltage and providing an output pulse when a predetermined relationship exists therebetween, and
   enabling means connected between the input terminal and the interval measurement circuit and responsive to said output pulse for allowing an input pulse received at the input terminal to be communicated to the interval measurement circuit,
   said interval measurement circuit developing a voltage dependent on the time that has elapsed since receiving the input pulse communicated from said enabling means.

2. A one-shot circuit according to claim 1, wherein the interval measurement circuit comprises a second ramp generator for generating a ramp voltage dependent on the time that has elapsed since receiving an input pulse, and the frequency detector further comprises a potential divider so that the reference voltage developed by the frequency detector is related to said peak voltage by a predetermined factor.

3. A non-retriggerable one-shot circuit for extracting information representative of a clock having a period T from a sequence of input pulses such that the interval between two consecutive input pulses is either T or T/2, said circuit having an input terminal for receiving said input pulses and comprising:
   a frequency detector connected to said input terminal for developing a reference voltage dependent on T, the frequency detector comprising a first ramp generator for generating a voltage that increases monotonically with passage of time after occurrence of an input pulse in said sequence, and a hold circuit for holding the peak voltage of the ramp,
   an interval measurement circuit,
   a comparator for comparing the voltage developed by the interval measurement circuit with the reference voltage and providing an output pulse when a predetermined relationship exists therebetween, and
   enabling means connected between the input terminal and the interval measurement circuit and responsive to said output pulse for allowing an input pulse received at the input terminal to be communicated to the interval measurement circuit,
   said interval measurement circuit developing a voltage dependent on the time that has elapsed since receiving the input pulse communicated from said enabling means and comprising a second ramp generator for generating a voltage that increases monotonically with the passage of time after receiving the input pulse communicated from said enabling means.

4. A one-shot circuit according to claim 3, wherein the first and second ramp generators comprise respective storage capacitors, the capacitance of the storage capacitor of the first ramp generator being substantially equal to the capacitance of the storage capacitor of the second ramp generator, whereby the peak voltage generated by the first ramp generator is substantially equal to the peak voltage generated by the second ramp generator, and wherein the frequency detector further comprises a divider for generating the reference voltage as a predetermined fraction of the peak voltage generated by the first ramp generator.

5. A circuit for extracting information representative of a clock having a period T from a sequence of input transitions such that the interval between two consecutive input transitions is either T or T/2, said circuit comprising:
   a differentiator connected to receive the sequence of input transitions and providing a sliver pulse in response to each input transition,
   a retriggerable frequency detector for receiving the sliver pulses and developing a reference voltage dependent on T,
   an interval measurement circuit connected to receive sliver pulses for developing a voltage dependent on the time that has elapsed since receiving a sliver pulse, a comparator for comparing the voltage developed by the interval measurement circuit with the reference voltage and providing an output pulse when a predetermined relationship exists therebetween, and enabling means connected between the differentiator and the interval measurement circuit and responsive to said output pulse for allowing a sliver pulse provided by the differentiator to be communicated to the interval measurement circuit.

6. A circuit according to claim 5, wherein the frequency detector comprises a retriggerable ramp generator for generating a voltage ramp of which the amplitude depends on the time that has elapsed since occurrence of a sliver pulse, and a hold circuit for holding the peak voltage of the ramp.

7. A circuit according to claim 5, wherein the frequency detector comprises a first retriggerable ramp generator for generating a voltage ramp of which the amplitude depends on the time that has elapsed since occurrence of a sliver pulse, and a hold circuit for holding the peak voltage of the ramp, and the interval measurement circuit comprises a second ramp generator for generating a ramp voltage dependent on the time that has elapsed since receiving a sliver pulse.

8. A circuit according to claim 7, wherein the frequency detector further comprises a potential divider so that the reference voltage developed by the frequency detector is related to said peak voltage by a predetermined factor.

9. A circuit according to claim 5, wherein the frequency detector comprises a first ramp generator for generating a voltage that increases monotonically with passage of time after occurrence of a sliver pulse, and a hold circuit for holding the peak voltage, and wherein the interval measurement circuit comprises a second ramp generator for generating a voltage that increases monotonically with passage of time after receiving a sliver.

10. A circuit according to claim 9, wherein the first and second ramp generators comprise respective storage capacitors, the capacitance of the storage capacitor of the first ramp generator being substantially equal to the capacitance of the storage capacitor of the second ramp generator, whereby the peak voltage generated by the first ramp generator is substantially equal to the peak voltage generated by the second ramp generator, and wherein the frequency detector further comprises a divider for generating the reference voltage as a predetermined fraction of the peak voltage generated by the first ramp generator.

11. A non-retriggerable one-shot circuit for extracting information representative of a clock having a period T from a sequence of input pulses such that the interval between two consecutive input pulses is either T or T/2, said circuit having an input terminal for receiving said input pulses and comprising:

a frequency detector connected to said input terminal for developing a reference voltage dependent on T, said frequency detector comprising a first ramp generator for generating a voltage ramp of which the amplitude depends on the time that has elapsed since occurrence of an input pulse in said sequence, a comparator means for comparing the voltage developed by the interval measurement circuit with the reference voltage and providing an output pulse when a predetermined relationship exists therebetween, and enabling means connected between the input terminal and the interval measurement circuit and responsive to said output pulse for allowing a pulse received at the input terminal to be communicated to the interval measurement circuit, said interval measurement circuit developing a voltage dependent on the time that has elapsed since receiving the input pulse communicated from said enabling means and comprising a second ramp generator, substantially identical to the first ramp generator, for generating a voltage dependent on the time that has elapsed since receiving the input pulse communicated from said enabling means.

* * * * *

UNITED STATES PATENT AND TRADEMARK OFFICE
CERTIFICATE OF CORRECTION

PATENT NO. :   5,331,208
DATED       :   July 19, 1994
INVENTOR(S) :  Charles S. MEYER It is certified that error appears in the above-indentified patent and that said Letters Patent is hereby corrected as shown below:

Claim 1, line 7 (column 5, line 48), there should be a comma after "detector" and there should be a comma after "terminal".

Claim 11, lines 12 and 13 (column 8, lines 24 and 25),
--an interval measurement circuit,-- should be inserted between these lines.

Signed and Sealed this

Eighteenth Day of October, 1994

Attest:

BRUCE LEHMAN

*Attesting Officer*       *Commissioner of Patents and Trademarks*